United States Patent [19]

Habermann

[11] Patent Number: 4,774,424
[45] Date of Patent: Sep. 27, 1988

[54] DEVICE FOR MEASURING THE INDUCTION IN THE AIR GAP OF A MAGNETIC BEARING

[75] Inventor: Helmut Habermann, Vernon, France

[73] Assignee: Societe Europeenne de Propulsion, Puteaux, France

[21] Appl. No.: 829,218

[22] Filed: Feb. 14, 1986

[30] Foreign Application Priority Data

Feb. 15, 1985 [FR] France ................................ 85 02257

[51] Int. Cl.$^4$ ............................................. F16C 39/06
[52] U.S. Cl. .................................. 310/90.5; 310/187;
    310/254; 310/261; 310/68 R
[58] Field of Search .................... 310/90.5, 68 R, 168,
    310/169, 170, 186, 187, 68 B, 254, 67 R, 208,
    261; 324/200, 207, 208, 262

[56] References Cited

U.S. PATENT DOCUMENTS

| 2,193,406 | 3/1940 | Goss ..................................... 310/154 |
| 2,609,415 | 9/1952 | Dreyfus ............................... 310/169 |
| 2,827,582 | 3/1958 | Krebs .................................. 310/168 |
| 3,224,818 | 12/1965 | Sixsmith ............................ 310/90.5 |
| 3,466,477 | 9/1969 | Newill ............................... 310/68 R |
| 3,855,529 | 12/1974 | Langweller ....................... 324/158 |
| 3,932,811 | 1/1976 | Branch ............................... 324/158 |
| 3,937,533 | 2/1976 | Veillete .............................. 310/90.5 |
| 4,141,604 | 2/1979 | Habermann ....................... 310/90.5 |
| 4,387,935 | 6/1983 | Studer ................................. 310/90.5 |
| 4,428,244 | 1/1984 | Takeda ............................. 73/862.07 |
| 4,504,098 | 3/1985 | Battarel ............................. 310/90.5 |
| 4,561,313 | 12/1985 | Habermann et al. ............. 73/862.07 |

FOREIGN PATENT DOCUMENTS

1042093 10/1958 Fed. Rep. of Germany ...... 310/187
2420166 11/1975 Fed. Rep. of Germany .

OTHER PUBLICATIONS

"Paliers Magnetiques", by H. Habermann; publ. in Techniques de L'Ingineur; pp. B5345-1 and 4; 8-1984.
"Webster's Third New International Dictionary", by G. & C. Merriam Co.; 1976, pp. 1, 2 & 1969.
European Search Report dated 4/22/86.

Primary Examiner—R. Skudy
Attorney, Agent, or Firm—Staas & Halsey

[57] ABSTRACT

This invention relates to a device for measuring the induction in the air gap of a magnetic bearing, which comprises an assembly of small notches of small width made in the longitudinal direction of the rotor and distributed on the periphery thereof, an assembly of small coils disposed in the end faces of the poles of the stator frame located opposite the rotor, parallel to said small notches, and means for detecting the alternating voltage induced in each small coil due to the passage of the small notches of the rotor opposite said small coils.

8 Claims, 2 Drawing Sheets

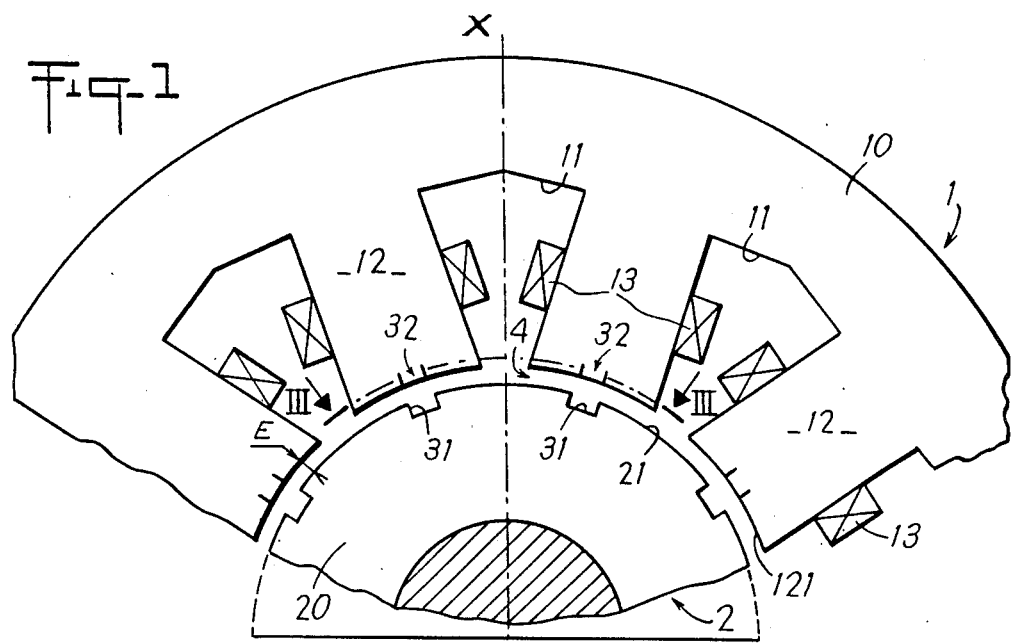
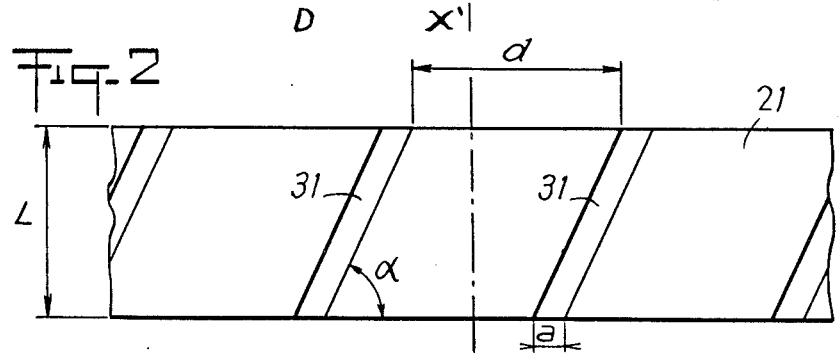
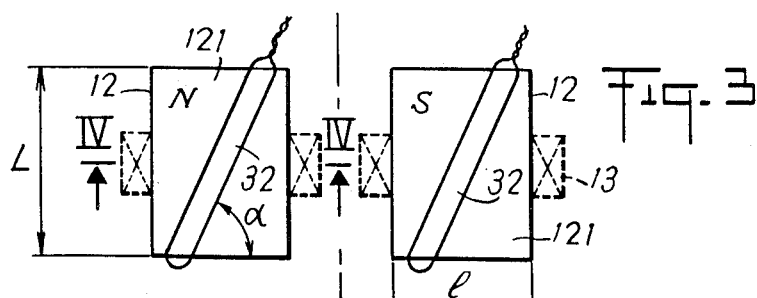
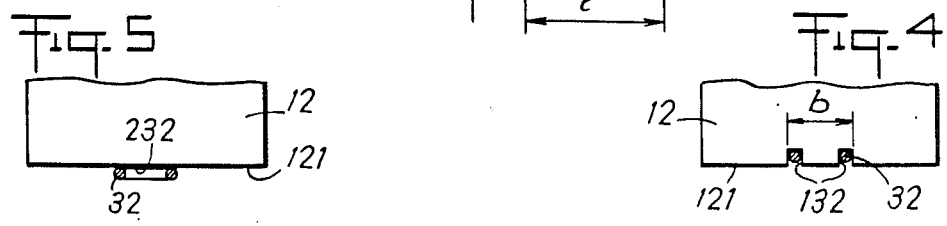

DEVICE FOR MEASURING THE INDUCTION IN THE AIR GAP OF A MAGNETIC BEARING

BACKGROUND OF THE INVENTION

The present invention relates to a device for measuring the induction in the air gap of a magnetic bearing comprising a rotor armature made of ferromagnetic material, a stator constituted on the one hand by a frame made of ferromagnetic material defining a succession of poles and of notches in its part located opposite the rotor armature and, on the other hand, by electro-magnet coils disposed in the notches of said frame, and an air gap located between the rotor and the stator.

In an active magnetic bearing, the current for energizing the stator electro-magnets is controlled from the detection signals delivered by detectors which measure at every moment the displacements of the bearing rotor with respect to the stator, in order to maintain the rotor in a predetermined position.

The lifting force of a magnetic bearing is proportional to the square of the magnetic induction in the air gap of the bearing and to the useful active surface of the magnetic circuit of the bearing.

It is often useful to effect a precise measurement of the force of a bearing. This is the case, for example, when it is desired to measure the force of traction of a metal sheet resting on magnetic bearings.

In that case, the determination of the magnetic induction necessary for determining the lifting force is effected by a calculation which takes into account the result of different measurements, particularly of the air gap and the current for energizing the electro-magnets of the bearing. However, this method cannot take into account the remanent field of the electro-magnets. The error thus introduced remains relatively small, but becomes appreciable for certain applications.

SUMMARY OF THE INVENTION

It is precisely an object of the present invention to remedy the above drawbacks and to effect a direct measurement of the induction in the air gap of a magnetic bearing, in order in particular to allow a precise determination of the force of attraction of the bearing.

It is a further object of the invention to allow a measurement of magnetic induction without it being necessary to employ measuring elements on the rotor and therefore to use commutators for taking signals which would be delivered by these measuring elements.

These objects are attained thanks to a device for measuring the induction in the air gap of a magnetic bearing which, according to the invention, comprises an assembly of small notches of small width made in the longitudinal direction of the rotor and distributed on the periphery thereof, an assembly of small coils disposed in the end faces of the poles of the stator frame located opposite the rotor, parallel to said small notches, and means for detecting the alternating voltage induced in each small coil due to the passage of the small notches of the rotor opposite said small coils.

According to a particular feature of the invention, the small coils disposed in the poles of the stator frame and the small notches made on the periphery of the rotor are inclined with respect to the axis of rotation of the rotor.

According to another feature, which makes it possible to avoid a modulation of the induction measured, the distance between two adjacent small notches corresponds to the width of a pole of the stator frame.

The width of the small coils disposed in the poles of the stator frame is substantially equal to the width of the small notches made on the periphery of the rotor.

In order not to affect the carrying capacity of the bearing whilst conserving a good sensitivity of measurement, the width of the small coils and of the small notches advantageously corresponds to about one tenth of the width of a pole of the stator frame.

According to a particular embodiment, the small coils are fixed by adhesion on the end faces of the poles of the stator frame.

According to another embodiment, the small coils are disposed in small notches made in the end faces of the poles of the stator frame.

The invention will be more readily understood on reading the following description with reference to the accompanying drawings, in which:

BRIEF DESCRIPTION OF THE DRAWINGS

FIG. 1 is a schematic partial view in section perpendicular to the axis of an active, radial magnetic bearing incorporating the induction measuring device according to the invention.

FIG. 2 is a plan view of the outer surface of the rotor of the bearing of FIG. 1.

FIG. 3 is a view of poles of the stator of the bearing of FIG. 1, along line III—III of FIG. 1.

FIG. 4 is a detailed view of a stator pole in section along line IV—IV of FIG. 3, FIG. 5 is alternate embodiment of the stator pole of FIG. 4.

DETAILED DESCRIPTION OF THE PREFFERED EMBODIMENTS

Figure 6:
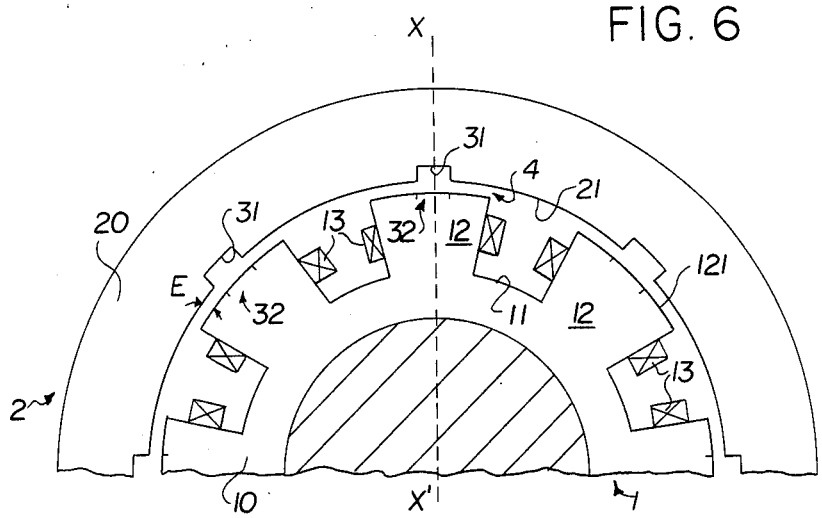
FIG. 6 is a schematic, partial view of an alternative embodiment of the present invention showing the stator and rotor reversed relative to FIG. 1.

Referring now to the drawings, FIG. 1 shows part of an active radial magnetic bearing comprising a stator 1 constituted by a frame 10 defining notches 11 and pole pieces 12, and electro-magnet windings 13 disposed around the pole pieces 12 in the notches 11. The frame 10 is formed by a stack of ferromagnetic plates perpendicularly to the axis of the bearing, i.e. parallel to the plane of FIG. 1. The stator 1 is coaxial to a rotor 2 constituted by an armature 20 made of laminated ferromagnetic material, which defines with poles 12 an air gap of width E.

The basic structure of an active magnetic bearing is well known and will not be described in detail. However, it will be noted that rotor 2 may be disposed either inside stator 1, as shown in FIG. 1, with the outer cylindrical surface 21 of rotor 2 lying opposite the terminal surfaces 121 of the pole pieces 12 of the stator 1, or outside stator 1 as shown in FIG. 6. In the latter case, the pole pieces 12 of stator 1 face outwardly and it is the inner cylindrical surface of the annular rotor which lies opposite the terminal surfaces of the pole pieces 12 of stator 1.

The carrying capacity of a magnetic bearing is proportional to the square of the magnetic induction in the air gap and to the useful active surface. The useful active surface is constituted by the sum of the surfaces of the terminal faces of poles 12 of the stator magnetic circuit and is therefore proportional to diameter D of the rotor, to the air gap and to the width L of the magnetic bearing. The useful active surface being constant for a given magnetic bearing, the force of attraction of the bearing, which is the resultant of the forces of attraction of the different electro-magnets constituted by pairs of adjacent poles 12 of opposite polarities and the corresponding windings, is therefore proportional to the magnetic induction in the air gap of the bearing.

In a magnetic bearing, the flux circuit of the electro-magnets is such that the major part of the energy of magnetization lies in the air gap. If, furthermore, the relative permeabilities of the magnetic plates of the rotor and of the stator are high, it may be considered that, for a given air-gap, the magnetic induction is proportional to the intensity I of the current circulating in the windings 13 of the stator electro-magnets. In that case, by measuring the intensity I of the current for energization of the stator electro-magnets, combined with a precise measurement of the value of the air-gap, the force of attraction of the bearing can be determined. Such a measurement of force thus depends on an indirect determination of the value of the magnetic induction in the air gap. Despite its convenience, this method is not entirely satisfactory for certain applications, or necessitates the introduction of correction factors, and does not take into account the remanent field of the electro-magnets.

The magnetic bearing according to the invention is thus equipped with a device for directly measuring the magnetic induction in the air-gap of the bearing, and consequently makes it possible to determine the lifting force of the bearing in a particularly reliable manner.

This induction measuring device essentially comprises an assembly of small coils 32 placed on the stator 1 and cooperating with small notches 31 made on the cylindrical surface 21 of the armature 20 of the rotor which defines the air gap 4 of the bearing. Each terminal face 121 of a pole piece 12 of the stator 1 comprises a small coil 32 and the number of the small notches 31 made on the rotor 2 is equal to the total number of small coils 32 and therefore to the poles of stator 1.

The small coils 32 and the small notches 31 are disposed lengthwise of the bearing (FIGS. 2 and 3), but are inclined by the same angle α with respect to the axis of rotation X'X of the bearing, similar to the notches made in the rotor of an induction motor which are inclined with respect to the axis of rotation of this rotor.

The distance d which separates two successive notches 31 of the rotor is equal to the width 1 of a pole 12 of the stator 1. In this way, any phenomenon of modulation of the signal delivered by the small coils 32 is avoided.

In operation, upon each passage of a small notch 31 beneath a small coil 32, an alternating voltage is induced in this small coil 32. Taking into account the fact that the geometrical characteristics of each small coil 32 are well determined, the alternating voltage produced upon passage of a notch 31 beneath the coil 32 is proportional to the magnetic induction in the air gap 4.

By taking the signals available at the terminals of the different small coils 32 disposed on the different poles 12 of the stator 1 when the rotation of rotor 2 causes notches 31 to pass opposite said small coils 32, a value proportional to the magnetic induction B may thus be obtained and the value of the force of the bearing may be deduced therefrom.

The width a of a notch 31 corresponds to the width b of a coil 32. Notch and coil widths a, b are advantageously chosen which correspond to about one tenth of the width 1 of a pole 12. This makes it possible not to reduce substantially the carrying capacity of the bearing whilst leading to voltages induced at the terminals of the small coils 32 which are sufficiently high to ensure a reliable and sensitive measurement of induction.

Each small coil 32 may be inserted in small notches 132 made in the terminal face 121 of the pole pieces 12 of the stator (FIG. 4). However, according to an alternate embodiment, the small coils 32, of which the thickness is much less than the width E of the average air gap 4, are simply connected to the terminal faces 121 of the pole pieces 12 and are fixed on these faces 121 for example via a small layer of adhesive 232. Fixation of the small measuring coils 32 is facilitated by the fact that the diameter of a magnetic bearing at the level of the air gap 4 is generally relatively large.

It will be noted that the device described hereinbefore requires no rotating contact insofar as all the coils are placed on the stator 1, whether it is a question of the windings 13 of electro-magnets of the bearing or of the small coils 32 for taking signals. Consequently, the practical embodiment is particularly simple and very reliable.

A magnetic bearing equipped with the induction measuring device according to the invention may be used for example within the framework of the application described in U.S. Pat. No. 4,561,313 and entitled: "Device for Measuring the Longitudinal Tension in a Strip of material. In such an application, which may concern for example the measurement of the forces of traction in a rolling mill the measurement of the induction in the air gap of a bearing may be substituted for the measurement of the current in the windings of the active magnetic bearing serving as a force detector in order to deliver a signal as a function of the effect of traction exerted on the strip of material in abutment on a roller mounted on said active magnetic bearing.

Figure 7:
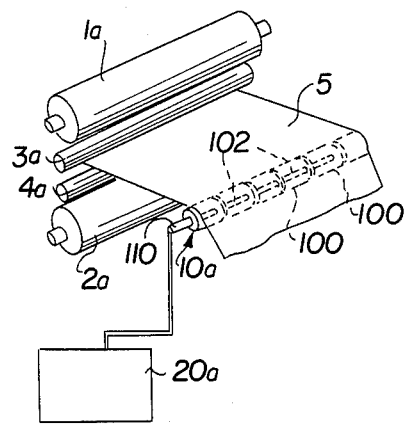
FIG. 7 is a schematic view showing use of the bearing according to the present invention in a rolling mill.

More particularly, FIG. 7 herein shows a rolling mill exit stand, such as described in U.S. Pat. No. 4,561,313 which includes a pair of supporting rolls 1a, 2a and a pair of work rolls 3a, 4a between which passes a steel strip 5. The flatness of the strip 5 is controlled by continuous measurement of the longitudinal tensile forces on this strip at different points along a transverse line to said strip 5. The longitudinal tensile forces are arranged with the help of a measuring roll 10a arranged parallel to rolls 1a through 4a, of the mill stand, downstream from said mill rolls, which measuring roll strip 5 bearingly overruns.

The measuring roll 10a is made up of a plurality of coaxially juxtaposed individual rolls 100 mounted on a fixed shaft 110 via active radial magnetic bearings 102, such as described above in relation to FIGS. 1 and 6. The signals output by the induction measuring devices shown in FIGS. 1 and 6 of the radial magnetic bearings 102 are processed by electronic circuits 20a to supply output data representing the value of the longitudinal tensile stresses on strip 5 at each individual roll 100.

A change in the stress occurring in the metal of strip 5 changes the pressure on each roll 100, and the value of this pressure on the roll is found by measuring the induction in the air gap of each bearing 102.

What is claimed is:

1. A device for measuring the induction in the air gap of a magnetic bearing, comprising:

(a) a rotor armature made of ferromagnetic material;
(b) a stator, including
   (i) a frame made of ferromagnetic material and defining a succession of poles having end faces,
   (ii) notches formed opposite the rotor armature, and
   (iii) electro-magnet coils disposed in the notches of said frame;
(c) an air gap located between the rotor armature and the stator;
(d) a plurality of small notches of small width made in the longitudinal direction of the rotor and distributed on the periphery thereof;
(e) a plurality of small coils disposed in the end faces of the poles opposite the rotor armature corresponding to said notches; and
(f) means for detecting the alternating voltage induced in each small coil due to the passage of the small notches of the rotor opposite said small coils, which detected alternating voltage can be used to deduce values of the induction in the portions of the air gap which are located opposite the end faces of the poles of the stator frame which support said small coils.

2. The device of claim 1, wherein the small coils disposed in the poles of the stator frame and the small notches made on the periphery of the rotor are inclined with respect to the axis of rotation of the rotor.

3. The device of claim 1, wherein the distance between two adjacent small notches corresponds to the width of a pole of the stator frame.

4. The device of any one of claim 1, wherein the width of the small coils disposed in the poles of the stator frame is substantially equal to the width of the small notches made on the periphery of the rotor.

5. The device of claim 4, wherein the width of the small coils and of the small notches corresponds to about one tenth of the width of a pole of the stator frame.

6. The device of any one of claim 1, wherein the small coils are fixed by adhesion on the end faces of the poles of the stator frame.

7. The device of any one of claim 1, wherein the small coils are disposed in small notches made in the end faces of the poles of the stator frame.

8. The device of claim 1, wherein the device is capable of measuring the force of traction in rolling mills.

* * * * *